(12) United States Patent
Puchner et al.

(10) Patent No.: US 6,977,400 B2
(45) Date of Patent: *Dec. 20, 2005

(54) SILICON GERMANIUM CMOS CHANNEL

(75) Inventors: Helmut Puchner, Santa Clara, CA (US); Gary K. Giust, Cupertino, CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/368,811

(22) Filed: Feb. 18, 2003

(65) Prior Publication Data

US 2003/0146494 A1 Aug. 7, 2003

Related U.S. Application Data

(62) Division of application No. 09/724,444, filed on Nov. 28, 2000, now Pat. No. 6,544,854.

(51) Int. Cl.[7] .................. H01L 29/76; H01L 31/117
(52) U.S. Cl. ..................................... 257/213; 257/616
(58) Field of Search .................. 438/93, 166, 170, 438/300, 302, 303, 308, 217, 299, 199, 795, 438/933, 197, 282, 285, 289; 257/24, 27, 257/66, 191, 190, 192, 194–196, 347, 616, 257/655, 18, 19, 213, 615, E27.001, E27.012

(56) References Cited

U.S. PATENT DOCUMENTS

| | | | |
|---|---|---|---|
| 5,155,571 A | * | 10/1992 | Wang et al. ................. 257/19 |
| 5,272,365 A | * | 12/1993 | Nakagawa ................. 257/194 |
| 5,891,769 A | * | 4/1999 | Liaw et al. ................. 438/167 |
| 6,310,367 B1 | * | 10/2001 | Yagishita et al. ........... 257/190 |
| 6,358,806 B1 | * | 3/2002 | Puchner ..................... 438/308 |

* cited by examiner

*Primary Examiner*—Brook Kebede
(74) *Attorney, Agent, or Firm*—Luedeka, Neely & Graham, P.C.

(57) ABSTRACT

A method for fabricating a semiconducting device on a substrate, where the improvement includes forming a strained silicon germanium channel layer on the substrate. A gate insulation layer is formed on top of the strained silicon germanium channel layer, at a temperature that does not exceed about eight hundred centigrade. A gate electrode is formed on top of the gate insulation layer, and the gate electrode is patterned. A low dose drain dopant is impregnated into the substrate, and activated with a first laser anneal. A source-drain dopant is impregnated into the substrate, and activated with a second laser anneal. After the step of activating the low dose drain dopant with the first laser anneal, an insulating layer is formed around the gate electrode, at a temperature that does not exceed about eight hundred centigrade, and a spacer is formed around the gate electrode. The spacer is formed of a material that is reflective to the second laser anneal. Thus, standard materials for the spacer, such as silicon oxide or silicon nitride are not preferred for this application, because they tend to be transparent to the laser beam emissions.

1 Claim, 4 Drawing Sheets

SILICON GERMANIUM CMOS CHANNEL

This is a division of application Ser. No. 09/724,444 filed Nov. 28, 2000, now U.S. Pat. No. 6,544,854.

FIELD

This invention relates to the field of semiconductor processing. More particularly the invention relates to a method for forming a silicon germanium complimentary metal oxide semiconductor channel in a semiconductor device.

BACKGROUND

As integrated circuits become more complex, engineers and scientists look for ways to reduce the surface area required on the substrate for the integrated circuit. Reducing the size of the integrated circuit tends hold to the chip size to a reasonable level, and the device also tends to be operable at a higher speed. Unfortunately, as the size of integrated circuits is reduced, limits and constraints in regard to the proper operation of various device structures are encountered.

For example, one of the fundamental challenges for developing logic circuits is optimizing the speed of the logic device. Because the mobility of holes tends to be lower than the mobility of electrons in many semiconducting materials, the drive current of PMOS transistors tends to be commensurately lower than the drive current of a similarly sized NMOS device, when each is driven at equal supply voltage potentials. Thus, the low drive current of the PMOS device tends to be one speed limiting parameter in certain circuits, such as a logic inverter.

One method of compensating for this situation is to form larger PMOS devices, relative to the size of the NMOS devices. Thus, the larger PMOS structure has an ability to carry a commensurately larger drive current at the same supply voltage potential, because of the increased numbers of carriers. Unfortunately, addressing the problem by increasing the size of the PMOS structures is in direct opposition to the design goal of creating ever smaller integrated circuits.

Another method of compensating for the speed difference is to increase the drive current of the PMOS device by increasing the potential of the supply voltage at which it is driven, relative to that of the NMOS device. Unfortunately, it is often desirable to drive both the PMOS device and the NMOS device at the same potential. Thus, compensating for the difference in drive currents between the two structures in this manner is somewhat unsatisfactory. Further, if the higher drive potential is available on the chip, then it seems somewhat of a waste to not use it to drive the NMOS device at an even greater drive current. Therefore, providing different supply voltages to the different devices to balance the drive currents of the devices tends to be somewhat of an inelegant solution. Additionally, increasing the supply voltages may jeopardize the reliability of the devices due to hot carrier injection into the gate dielectric.

What is needed, therefore, is a structure, and a method for its formation, that can be used in PMOS and NMOS devices to achieve high drive currents and keep leakage currents low.

SUMMARY

The above and other needs are met by a method for fabricating a semiconducting device on a substrate, where the improvement includes forming a strained silicon germanium channel layer on the substrate. A gate insulation layer is formed on top of the strained silicon germanium channel layer, the gate insulation layer preferably formed at a temperature that does not exceed about eight hundred centigrade. A gate electrode is formed on top of the gate insulation layer, and the gate electrode is patterned. A low dose drain dopant is impregnated into the substrate, and activated with a first laser anneal. A source-drain dopant is impregnated into the substrate, and activated with a second laser anneal. The source drain impregnations may be preceded by a high dose preamorphization implant. This preamorphization implant allows the fabrication of ultra shallow and highly activated source drain junctions by lowering the melting temperature of the silicon layer containing the dopant.

Thus, by use of the strained silicon germanium channel layer, the mobility of electrons and holes is increased by up to about seventy-five percent when applied to a 100 nanometer technology. However, use of strained silicon germanium imposes strong limitations in the applied thermal budget once the strained silicon germanium layer is formed. If the strained silicon germanium layer is annealed at a temperature higher than about 850 centigrade, then the layer tends to relax and loose it favorable conduction properties. Therefore, the subsequent layers are formed at temperatures that are preferably below about eight hundred centigrade. Further, laser annealing is used for locally activating both the low dose drain dopant and the source-drain dopant. Because the strained silicon germanium layer tends to have a lower thermal conductivity than that of the substrate, the heat generated by the laser pulses does not tend to anneal the strained silicon germanium channel layer during the laser annealing. Annealing by other more traditional methods, such as rapid thermal annealing or furnace annealing, would tend to exceed the thermal budget of the strained silicon germanium channel layer.

In various preferred embodiments the strained silicon germanium channel layer is formed such as by deposition with a chemical vapor deposition process or growth with a surface reaction epitaxy process. The strained silicon germanium channel layer further is formed to a thickness of preferably about thirty angstroms, with a tensile strain and a composition of silicon of about seventy percent. Further, the strained silicon germanium channel layer for an NMOS device is preferably formed with an in situ boron dopant at a concentration of about $10^{17}$ atoms per cubic centimeter. Still further, an additional dopant may be implanted into the strained silicon germanium channel layer after it is formed. PMOS devices are preferably formed with dopants compatible with PMOS designs, and with concentrations commensurate with such designs.

In a most preferred embodiment, after the step of activating the low dose drain dopant with the first laser anneal, an insulating layer is formed around the gate electrode, at a temperature that does not exceed about eight hundred centigrade, and a spacer is formed around the gate electrode. The spacer is formed of a material that is reflective to the second laser anneal. Thus, standard materials for the spacer, such as silicon oxide or silicon nitride are not preferred for this application, because they tend to be transparent to the laser beam emissions. However, depending on the wavelength of the applied laser, silicon oxide or silicon nitride may still be used as a spacer material as long as the laser beam is reflected and protects the area underneath.

Most preferably the insulating layer around the gate electrode is formed of silicon oxide and the spacer material is formed of polysilicon. In other preferred embodiments, the substrate is silicon, the gate insulation layer is silicon oxide, and the gate electrode is amorphous silicon.

According to another aspect of the invention, a semiconductor device is presented, the improvement being a strained silicon germanium channel layer and a spacer around the gate electrode formed of a material that is reflective to the laser anneal.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
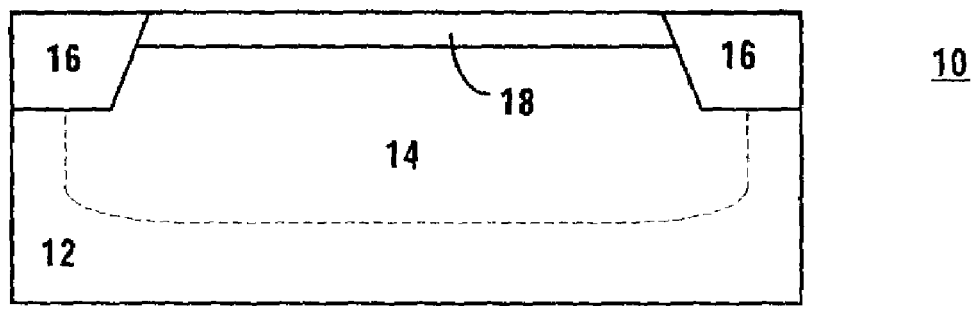
FIG. 1 is a cross-sectional view of an integrated circuit substrate.

Turning now to the drawings, there is depicted in FIG. 1 a cross sectional view of a substrate 12 for an integrated circuit 10. The substrate 12 is preferably a silicon substrate. However, in alternate embodiments, substrates of other materials are also acceptable, with commensurate modification of the materials and dopants selected for the various other structures to be formed on the substrate 12, as described below.

The substrate 12 is depicted in FIG. 1 at a point in the processing where several structures have already been formed. For example, isolation structures 16 have been formed in the substrate 12. If the substrate 12 is formed of silicon, the isolation structures 16 are preferably silicon oxide, but may also be formed of silicon nitride or a combination of the two materials, or one or more of a number of different, substantially nonconductive materials. Further, differing types of isolation structures 16 may be so employed, such as plug isolation or, more preferably, shallow trench isolation.

A well 14 has also been formed in the substrate 12 by impregnating a dopant into the substrate 12. The dopant may be impregnated either during a diffusion process or more preferably by ion implantation. The specific dopant selected is dependant upon the type of device that is to be formed, whether PMOS or NMOS. In the example presented below, the specific example of an NMOS device is given. However, it is appreciated that the invention is equally applicable to PMOS devices. For the NMOS device depicted in FIG. 1, a dopant such as boron or indium is preferably used.

An anti-punchthrough layer 18 is formed by impregnating a dopant into the well 14. The dopant for the anti-punchthrough layer 18 may be introduced to the substrate 12 by diffusion, or more preferably by ion implantation.

Figure 2:
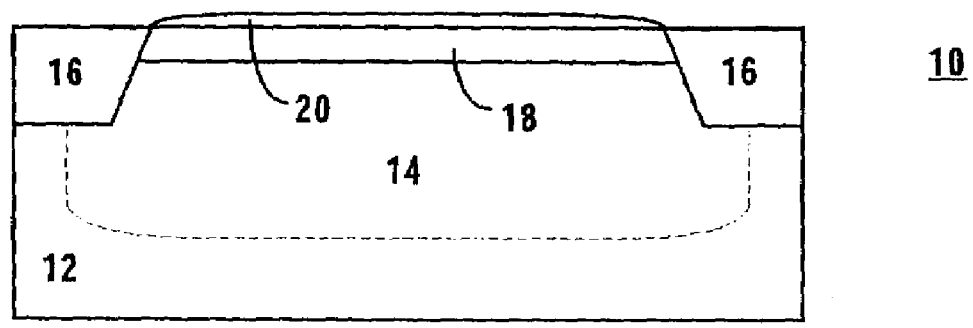
FIG. 2 is a cross-sectional view of the integrated circuit substrate with a strained silicon germanium channel layer.

In FIG. 2, a strained silicon germanium channel layer 20 overlies the anti-punchthrough layer 18. The strained silicon germanium channel layer 20 can be formed according to one or more of a variety of methods. For example, the strained silicon germanium channel layer 20 can be deposited by a chemical vapor deposition process, and then patterned and etched to form the structure as depicted over the anti-punchthrough layer 18 in FIG. 2. However, most preferably the strained silicon germanium channel layer 20 is grown from the silicon of the substrate 12 using a surface reaction epitaxy process.

To achieve high drive currents in the integrated circuit 10, and to keep leakage currents low, a super steep retrograde channel profile is desirable for the channel region of the integrated circuit 10, as described below. The strained silicon germanium channel layer 20 is preferably grown to a thickness of between about fifteen angstroms and about three hundred angstroms, and most preferably about thirty angstroms, depending on the concentration of the germanium. The strain within the strained silicon germanium channel layer 20 is preferably a tensile stress resulting from the difference in the lattice constant when a silicon germanium layer 20 is grown on top of a silicon substrate 12. The strain-induced conduction band offset at the heterointerface between the bulk silicon 12 and the silicon germanium layer 20 leads to the formation of a two-dimensional electron gas in the strained silicon germanium layer 20, and a substantial enhancement of the electron or hole mobility over the bulk mobility is observed.

The strained silicon germanium channel layer 20 is preferably formed with an in situ dopant, which for the specific example of the NMOS structure is most preferably boron, but may also be a material such as indium. The dopant is preferably found in the strained silicon germanium channel layer 20 at a concentration of between about $10^{16}$ atoms per cubic centimeter and about $10^{19}$ atoms per cubic centimeter, and most preferably about $10^{17}$ atoms per cubic centimeter. In alternate embodiments, an additional amount of the dopant can be introduced to the strained silicon germanium channel layer 20 after it is formed, either by diffusion or more preferably by ion implantation. Both the in situ doping of the strained silicon germanium channel layer 20 and the optional additional implantation are used to adjust the threshold voltage of the device 10.

Figure 3:
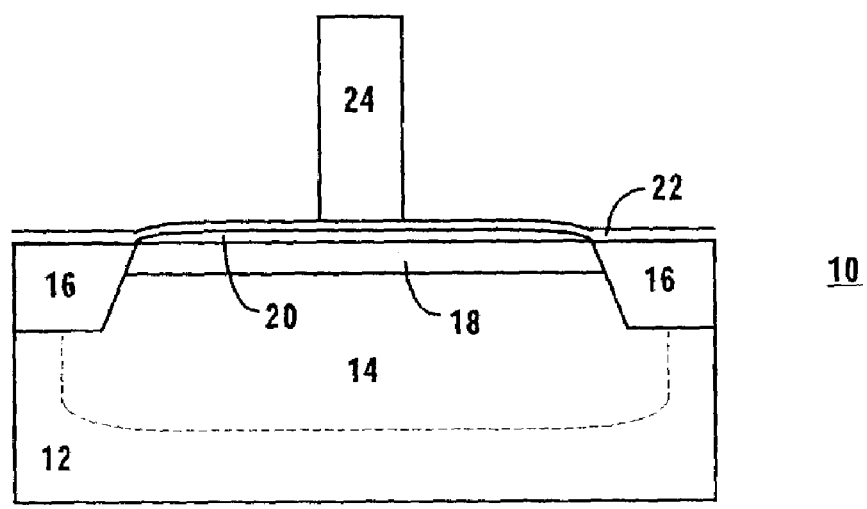
FIG. 3 is a cross-sectional view of a strained silicon germanium channel layer, with an overlying insulating layer and a patterned gate electrode.

Referring now to FIG. 3, an insulation layer 22 overlies the strained silicon germanium channel layer 20. To continue the example of a silicon based integrated circuit 10, the insulation layer 22 is preferably formed of silicon oxide, which is either deposited or grown. However, other materials that are compatible with both the functions of the insulation layer 22 and the other materials as described herein may also be selected. Further, other processes, also compatible with the constraints as imposed by the other structures as described herein, may also be used to form the insulation layer 22. Additionally, other layers may preferably be deposited to buffer the silicon germanium layer 20 before the gate dielectric layer 22 is formed, in order to enhance the quality of the gate dielectric layer 22.

Regardless of the method employed to form the insulation layer 22, it is preferably formed at temperatures that do not exceed about eight hundred centigrade. The purpose of limiting the temperature of this and subsequent processing to about this temperature is to preserve and retain the desirable properties of the strained silicon germanium channel layer 20. One of the benefits of the strained silicon germanium channel layer 20 is that it exhibits an increased mobility for both electrons and holes, and thus an increased drive current, at a given potential.

One reason for this increased carrier mobility is the strain-induced conduction band offset that is present within the strained silicon germanium channel layer 20. As processing temperatures approach and exceed about 850 centigrade, the strained silicon germanium channel layer 20 is annealed and relaxes, and the stress within the strained silicon germanium channel layer 20 is dissipated. This tends to reduce in large measure the enhanced carrier mobility properties of the strained silicon germanium channel layer 20. Thus, care is preferably exercised to ensure that subsequent processing does not exceed about 850 centigrade, and most preferably does not exceed about eight hundred centigrade for any appreciable length of time.

Also depicted in FIG. 3 is a patterned gate electrode 24 residing atop the gate insulation layer 22. In the specific example as described herein, the gate electrode 24 is preferably formed of a conductive material, such as a heavily doped polysilicon.

Figure 4:
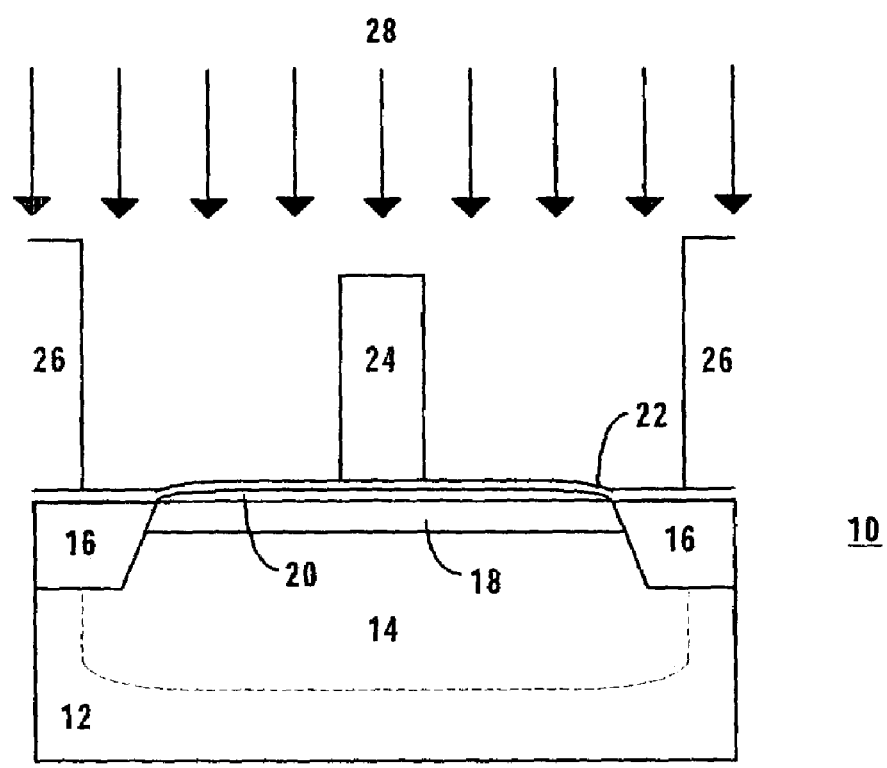
FIG. 4 is a cross-sectional view of the structure of FIG. 3, with the structure masked for low dose dopant impregnation.

The low dose drain dopants 28 are preferably impregnated into the substrate 12 as depicted in FIG. 4. For the example of a silicon substrate 12 and an NMOS integrated circuit 10 as previously described herein, the low dose drain dopant 28 is preferably a species such as arsenic and antimony. The low dose drain dopants 28 are impregnated into the substrate 12 by one or more of a number of different processes such diffusion and most preferably ion implantation. Prior to impregnation of the low dose drain dopants, the source and drain areas may be optionally amorphized with a species such as silicon, germanium, or argon. The amorphization tends to lower the thermal budget necessary to melt the crystal.

Figure 5:
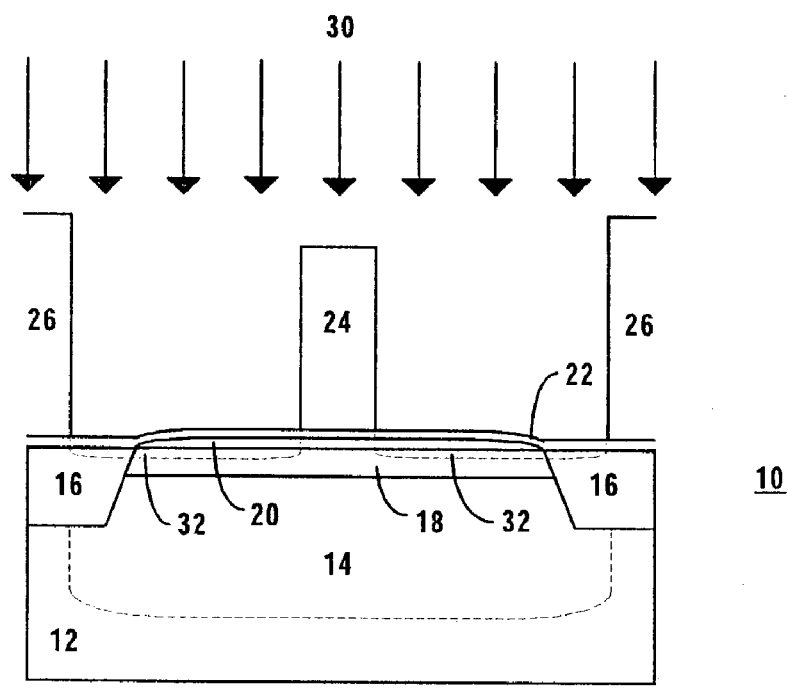
FIG. 5 is a cross-sectional view of the structure of FIG. 4, depicting the first laser anneal.

The low dose drain dopants 28 form doped regions 32, as depicted in FIG. 5. The low dose drain dopants in the regions 32 are activated by application of thermal energy 30. As mentioned above, it is highly desirable that the strained silicon germanium channel layer 20 not experience temperatures above about eight hundred centigrade. Thus, many convention anneal processes are not compatible with the design constraints of the present system, where on one hand the thermal energy must be sufficiently great as to activate the low dose drain implants, at least within the regions 32, and on the other hand the thermal energy must be sufficiently low as to not elevate the temperature of the strained silicon germanium channel layer 20 above about eight hundred centigrade.

Therefore, the thermal energy 30 is preferably provided in a first laser anneal of the integrated circuit 10. Preferably, the low dose drain dopants in the regions 32 are activated with a laser fluence of between about 0.1 joules per square centimeter and about two joules per square centimeter, and most preferably about 0.65 joules per square centimeter for a 308 nanometer laser beam system. The laser fluence may vary for different laser beam wavelengths. Because the thermal conductivity of the strained silicon germanium channel layer 20 tends to be very low, the strained silicon germanium channel layer 20 tends to not heat during the first laser anneal process, and thus is able to remain at a temperature below about eight hundred centigrade, while at the same time the thermal energy delivered by the first laser anneal to the silicon substrate 12, which has a higher thermal conductivity, is sufficient to highly activate the low dose drain dopants within the regions 32. Further, the preferred polysilicon material of the gate electrode 24, which is reflective to the laser energy and thus tends to not pass the laser energy, tends to protect the strained silicon germanium channel layer 20 in the area underlying the gate electrode 24.

Figure 6:
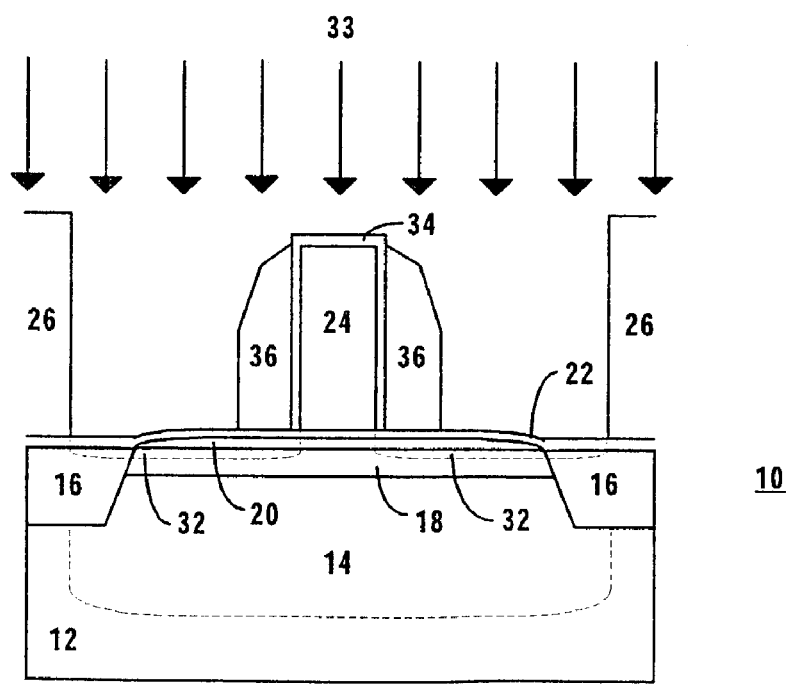
FIG. 6 is a cross-sectional view of the structure of FIG. 5, depicting the insulating layer and the spacer around the gate electrode, and the source-drain impregnation.

FIG. 6 depicts the integrated circuit 10 at a point in the processing at which an insulating layer 34 has been formed around the gate electrode 24. To continue the example started above, the insulating layer 34 is most preferably silicon oxide that is grown from the polysilicon of the gate electrode 24. However, even in the specific example of silicon technology, as used herein, other compatible materials and formation processes may be used to create the insulating layer 34.

As mentioned above, it is a design goal of the present invention to avoid processing the integrated circuit 10 at temperatures above eight hundred centigrade. Thus, the silicon oxide of the insulating layer 34 is preferably formed at a temperature that does not exceed about eight hundred centigrade. Most preferably, a polyreoxidation process is used to form the silicon oxide insulating layer 34 on the polysilicon gate electrode 24.

Also depicted in FIG. 6 is a spacer 36 around the gate electrode 24. In the example started above, the spacer 26 is preferably formed of polysilicon. The material selected for the spacer 26 is preferably reflective of, rather than transmissive of, laser energy, such as is applied during a laser annealing process, as described more completely below. Thus, according to the present invention, neither silicon oxide nor silicon nitride are preferred selections for the material of the spacer 36, because each of these materials tends to transmit laser energy rather than to reflect laser energy. However, different laser sources may also permit the use of silicon oxide or silicon nitride, as briefly mentioned above.

Further depicted in FIG. 6 is the impregnation of a source-drain dopant 33 into the substrate 12. The source-drain dopant 33 may be impregnated according to one or more of a number of different processes, such as diffusion or more preferably ion implantation. In the specific example of a silicon NMOS integrated circuit 10, as introduced above, the source-drain dopant 33 is preferably one or more of arsenic or antimony. Prior to impregnating the source-drain dopant the silicon substrate 12 may be amorphized by implantation of high doses of either silicon, germanium or argon.

Figure 7:
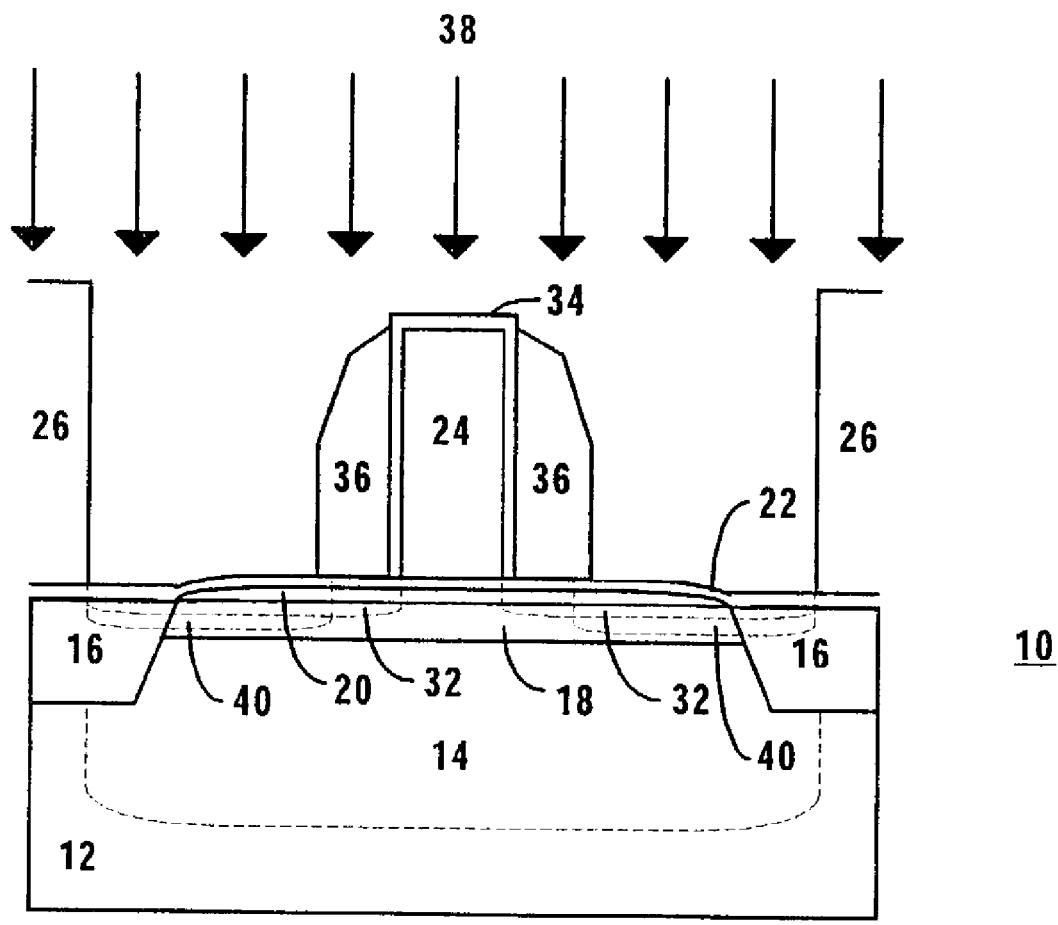
FIG. 7 is a cross-sectional view of the structure of FIG. 7, depicting the second laser anneal.

The impregnated source-drain dopant 33 forms source-drain regions 40 in the substrate 12, as depicted in FIG. 7. The source-drain dopants in the regions 40 are activated by application of thermal energy 38. As mentioned above, it is highly desirable that the strained silicon germanium channel layer 20 not experience temperatures above about eight hundred centigrade. Thus, many conventional anneal processes are not compatible with the design constraints of the present system, where on one hand the thermal energy must be sufficiently great as to activate the source-drain implants, and on the other hand the thermal energy must be sufficiently low as to not elevate the temperature of the strained silicon germanium channel layer 20 above about eight hundred centigrade.

Therefore, the thermal energy 38 is preferably provided in a second laser anneal of the integrated circuit 10. Preferably, the source-drain dopants in the regions 40 are activated with a laser fluence of between about 0.1 joules per square centimeter and about two joules per square centimeter, depending on the final depth of the source/drain junction, and most preferably about 0.7 joules per square centimeter. The laser may be applied as a single pulse or in a multi-pulsed mode where the fluence is turned on and off with a certain frequency. As described above, because the thermal conductivity of the strained silicon germanium channel layer 20 tends to be very low, the strained silicon germanium channel layer 20 tends to not substantially heat during the second laser anneal process, and thus is able to remain at a temperature below about eight hundred centigrade, while at the same time the thermal energy delivered by the second laser anneal to the silicon substrate 12, which has a higher thermal conductivity, is sufficient to highly activate the source-drain dopants within the regions 40. Further, the preferred polysilicon material of the gate electrode 24 and the spacer 36, which is reflective to the laser energy and thus tends to not pass the laser energy, tends to protect the strained silicon germanium channel layer 20 in the area underlying the gate electrode 24 and the spacer 36.

The second laser anneal is preferably performed at a higher laser fluence than the first laser anneal, so as to achieve a deeper melting of the substrate 12 in the source-drain regions 40, and thereby more fully activate the dopant in the source-drain regions 40. However, in alternate embodiments the fluence of the second laser anneal is less than the fluence of the first laser anneal in order to avoid melting. In further embodiments, multiple laser pulsing of the second laser anneal is performed to shape the source-drain region 40 doping profile according to a desired configuration. Thus, the precision and versatility of the laser annealing process is beneficial in both retaining the strain within the strained silicon germanium channel layer 20 and in selectively activating portions of the substrate 12, as well as providing for a highly configurable doping profile.

In a further embodiment, a reflective layer may be deposited on top of gate electrode 24 before forming the insulation layer 34 to further protect the gate electrode 24 from being melted too deep. The thermal transfer from the melted gate electrode 24 towards the channel region 20 is preferably minimized to keep the channel layer 20 below 800 centigrade. Otherwise the channel layer 20 tends to loose its preferable conduction properties.

Although the source-drain dopant and second laser anneal are described herein after the description of the formation of the insulating layer 34 and the spacer 36, it is appreciated that the source-drain dopant impregnation and the second laser anneal could, in alternate embodiments, be performed prior to the formation of the insulating layer 34 and the spacer 36. Similarly, other steps of the method as described above may also be performed in an order that differs from that as given above.

Thus a semiconductor device may be formed from the integrated circuit 10 described above, by completing the processing with contact creation and back end processing. The semiconducting device so formed is distinguishable from other semiconducting devices formed by other processes, because it has a strained silicon germanium channel layer, which still exhibits a high degree of tensile strain, and has spacers on the gate electrode, which spacers are formed of a laser-reflective material such as polysilicon, rather than of a more conventional material such as silicon oxide or silicon nitride.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A semiconductor device formed according to a method for fabricating a semiconducting device on a substrate, the improvement comprising the sequential steps of:

forming a strained silicon germanium channel layer on the substrate, forming a gate insulation layer on top of the strained silicon germanium channel layer at a temperature that does not exceed about eight hundred centigrade, forming a gate electrode on top of the gate insulation layer, patterning the gate electrode, impregnating a low dose drain dopant into the substrate, activating the low dose drain dopant with a first laser anneal that activates desired portions of the low dose drain dopant without relaxing and heating the strained silicon germanium channel layer disposed beneath the gate electrode, thereby limiting diffusion of the low dose drain dopant underneath the gate electrode, impregnating a source-drain dopant into the substrate, and activating the source-drain dopant with a second laser anneal that activates desired portions of the source-drain drain dopant without relaxing and heating the strained silicon germanium channel layer disposed beneath the gate electrode, thereby limiting diffusion of the source-drain drain dopant underneath the gate electrode.

* * * * *